(12) United States Patent  
Becker et al.

(10) Patent No.: US 9,190,628 B2  
(45) Date of Patent: Nov. 17, 2015

(54) OPTOELECTRONIC COMPONENT AND METHOD FOR PRODUCING AN OPTOELECTRONIC COMPONENT

(75) Inventors: Dirk Becker, Langquaid (DE); Erwin Lang, Regensburg (DE); Daniel Steffen Setz, Munich (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 14/117,888

(22) PCT Filed: Mar. 29, 2012

(86) PCT No.: PCT/EP2012/055602  
§ 371 (c)(1),  
(2), (4) Date: Nov. 15, 2013

(87) PCT Pub. No.: WO2012/163569  
PCT Pub. Date: Dec. 6, 2012

(65) Prior Publication Data  
US 2014/0077201 A1    Mar. 20, 2014

(30) Foreign Application Priority Data  
May 31, 2011  (DE) .......................... 10 2011 076 750

(51) Int. Cl.  
*H01L 51/52* (2006.01)  
*H01L 51/56* (2006.01)  
*H01L 51/10* (2006.01)  
*H01L 51/44* (2006.01)

(52) U.S. Cl.  
CPC .......... *H01L 51/5275* (2013.01); *H01L 51/107* (2013.01); *H01L 51/448* (2013.01); *H01L 51/5246* (2013.01); *H01L 51/5253* (2013.01); *H01L 51/56* (2013.01); *H01L 2251/5369* (2013.01); *Y02E 10/549* (2013.01)

(58) Field of Classification Search  
CPC .......................... H01L 51/5275; H01L 51/56  
USPC ............ 257/40, 59, 88, 95, E33.001; 438/29  
See application file for complete search history.

(56) References Cited

U.S. PATENT DOCUMENTS

| | | | |
|---|---|---|---|
| 6,435,734 B2 * | 8/2002 | Okada et al. ................... 385/88 |
| 6,867,539 B1 * | 3/2005 | McCormick et al. ......... 313/504 |
| 7,313,302 B2 * | 12/2007 | Fincato et al. .................. 385/43 |
| 8,314,541 B2 | 11/2012 | Lang et al. |
| 8,500,302 B2 | 8/2013 | Ohta |

(Continued)

FOREIGN PATENT DOCUMENTS

| CN | 1953199 A | 4/2007 |
|---|---|---|
| CN | 101030627 A | 9/2007 |

(Continued)

OTHER PUBLICATIONS

International Search Report for PCT/EP2012/055602 dated Jul. 16, 2012.

(Continued)

*Primary Examiner* — Sheng Zhu

(57) ABSTRACT

An optoelectronic component may include: at least one layer of the optoelectronic component; at least one adhesive on the layer of the optoelectronic component; and a cover on the at least one adhesive; wherein the at least one adhesive is cured only in a partial region above at least one of a substrate and the layer.

20 Claims, 11 Drawing Sheets

(56) References Cited

U.S. PATENT DOCUMENTS

| | | | |
|---|---|---|---|
| 2004/0031977 A1* | 2/2004 | Brown et al. | 257/222 |
| 2004/0217702 A1* | 11/2004 | Garner et al. | 313/512 |
| 2007/0090759 A1 | 4/2007 | Choi et al. | |
| 2008/0018231 A1 | 1/2008 | Hirakata | |
| 2008/0143247 A1* | 6/2008 | Kim et al. | 313/504 |
| 2009/0041500 A1 | 2/2009 | Mitsumori et al. | |
| 2009/0053634 A1 | 2/2009 | Mitsumori et al. | |
| 2009/0180807 A1 | 7/2009 | Mitsumori et al. | |
| 2009/0291379 A1 | 11/2009 | Oota et al. | |
| 2010/0012966 A1 | 1/2010 | Choi et al. | |
| 2011/0278557 A1* | 11/2011 | Konno et al. | 257/40 |
| 2012/0007107 A1* | 1/2012 | Choi | 257/88 |
| 2012/0064318 A1 | 3/2012 | Keite-Telgenbüscher et al. | |

FOREIGN PATENT DOCUMENTS

| | | |
|---|---|---|
| CN | 101410763 A | 4/2009 |
| CN | 101858994 A | 10/2010 |
| DE | 102004035965 B4 | 7/2007 |
| DE | 10234162 B4 | 2/2008 |
| DE | 102007044597 A1 | 4/2009 |
| DE | 102008023874 A1 | 8/2009 |
| DE | 102009018518 A1 | 10/2010 |
| EP | 1777748 A2 | 4/2007 |
| EP | 1830421 A2 | 9/2007 |
| JP | 2003197366 A | 7/2003 |
| JP | 2005332615 A | 12/2005 |
| JP | 2007115692 A | 5/2007 |
| JP | 4590932 B2 | 12/2010 |
| WO | 2011052006 A1 | 5/2011 |

OTHER PUBLICATIONS

The Korean office action dated Oct. 20, 2014.
Korean Office Action based on application No. 10-2013-7035048 (3 pages of English translation) dated Mar. 31, 2015.
Chinese Office Action based on Application No. 201280026783.X (10 pages and 10 pages of English translation) dated Jul. 3, 2015.

* cited by examiner

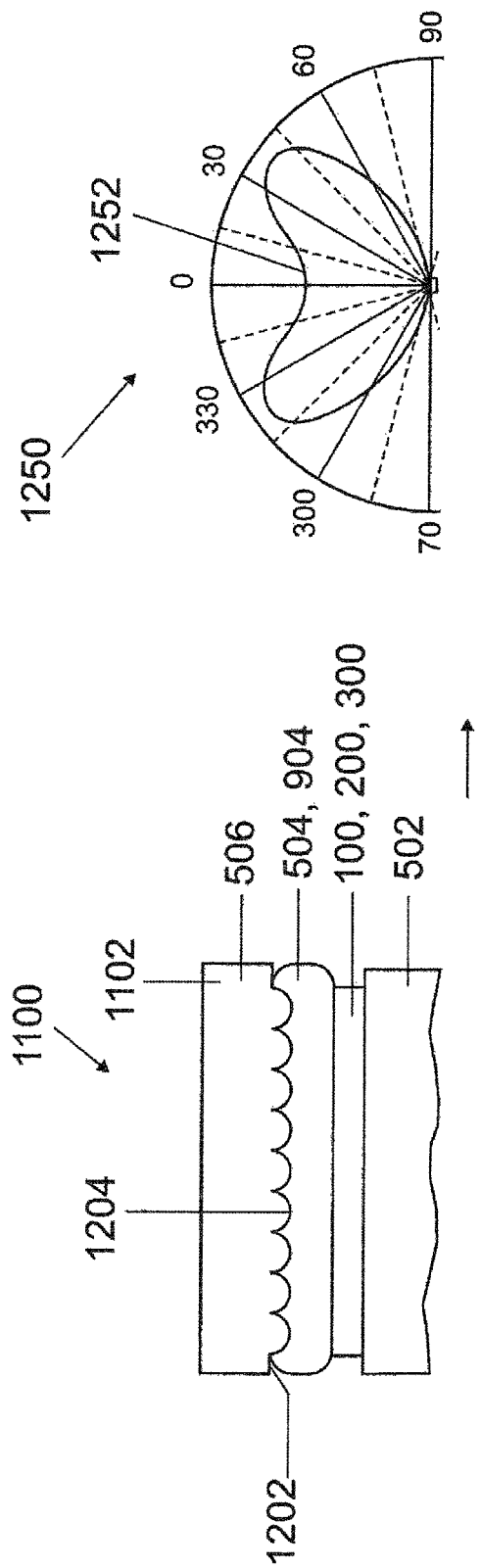

OPTOELECTRONIC COMPONENT AND METHOD FOR PRODUCING AN OPTOELECTRONIC COMPONENT

RELATED APPLICATIONS

This applications is a national stage entry according to 35 U.S.C. §371 of PCT application No.: PCT/EP2012/055602 filed on Mar. 29, 2012, which claims priority from German application No.: 10 2011 076 750.9 filed on May 31, 2011.

TECHNICAL FIELD

Various embodiments relate to an optoelectronic component and to a method for producing an optoelectronic component.

BACKGROUND

Organic light emitting diodes (OLED), in particular stacked organic light emitting diodes, have hitherto been susceptible to roughnesses on the substrate surfaces or particles or inhomogeneities in the layers or the like which are incorporated into the layers of the organic light emitting diodes during processing. Such particles can lead to so-called latent short circuits (also designated as hotspots) in a respective organic light emitting diode, which initially inter alia cannot yet be detected, i.e. for example have no signature in infrared spectroscopy or have an increased electrical background signal. However, such hotspots can later lead to failures of the OLED during the operation of the OLED.

In order to avoid such spontaneous short circuits of stacked OLEDs, it is customary to provide a thick doped hole conductor layer (hole injection layer (HIL), also designated as hole transport layer (HTL)), usually having a layer thickness of several hundred nm, as a so-called shorts protection layer. Particles or the like are thereby intended to be leveled. However, suitable materials therefor are still very expensive and constitute a considerable cost factor. It generally holds true that the thicker the HIL layer, the greater the short-circuit resistance of the OLED.

SUMMARY

In various embodiments, the short-circuit behavior of an optoelectronic component, for example of an organic light emitting diode (OLED), for example of a thin-film-encapsulated OLED, is reduced by a novel method or a novel process for realizing for example the rear-side technology (for example the cover lamination, for example the glass lamination). By adapting the new method/process in accordance with various embodiments, new possibilities are provided for realizing effective coupling-out layers or for influencing the emission characteristic (or the absorption characteristic) of the optoelectronic component (for example of the OLED), for example in the case of a top emitting OLED, and for improving the heat distribution or the thermal management in the optoelectronic component (for example the OLED).

In various embodiments, an optoelectronic component is provided. The optoelectronic component may include at least one layer of the optoelectronic component; at least one adhesive over the layer of the optoelectronic component; and a cover over the adhesive; wherein the at least one adhesive is cured only in a partial region above the substrate and/or above the layer.

In one configuration, the partial region may include the edge region of the adhesive.

In another configuration, the edge region may be at least one part of a circumferential structure of the adhesive.

In another configuration, the partial region may be arranged at least partly laterally outside an active region of the optoelectronic component. In various embodiments, an active region may be a region of the optoelectronic component which lies in the beam path of the light emitted by the optoelectronic component or of the light received by the optoelectronic component.

In another configuration, the at least one adhesive may include a plurality of adhesives of different viscosity.

In another configuration, particles may be provided in the adhesive, said particles having a different refractive index than the adhesive.

In another configuration, the adhesive may have a lower refractive index than the cover.

In another configuration, an optically refractive layer may be provided on at least one surface of the cover.

In various exemplary embodiments, a refractive layer may be understood to mean a layer having periodic structures, for example of the order of magnitude of a plurality of micrometers. In various embodiments, a refractive layer may include lenses, pyramids, or truncated cone structures.

In another configuration, the partial region may at least partly enclose a region in which a liquid non-adhesive material or a liquid adhesive is provided.

In another configuration, the optoelectronic component may be designed as or may include a light emitting diode, for example an organic light emitting diode.

In another configuration, the layer may be an encapsulation layer of the optoelectronic component.

In another configuration, the cover may include or be glass or a film.

In various embodiments, a method for producing an optoelectronic component is provided, wherein the method includes: applying a cover to a layer of the optoelectronic component by means of at least one adhesive; and varying the viscosity of the at least one adhesive only in a partial region above a substrate of the optoelectronic component and/or above the layer or only outside the layer.

In one configuration, the viscosity may be varied by means of light irradiation.

In another configuration, the light irradiation may be effected by means of irradiation by ultraviolet light.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which:

FIGS. 12A and 12B show a cross-sectional view of an optoelectronic component (FIG. 12A) in accordance with various embodiments and an associated emission profile (FIG. 12B)

DETAILED DESCRIPTION

The following detailed description refers to the accompanying drawing that show, by way of illustration, specific details and embodiments in which the disclosure may be practiced.

In the context of this description, the terms "connected" and "coupled" are used to describe both a direct and an indirect connection and a direct or indirect coupling. In the figures, identical or similar elements are provided with identical reference signs, insofar as this is expedient.

In various embodiments, an optoelectronic component is provided.

In various embodiments, the optoelectronic component may be embodied as an organic light emitting diode (OLED), as an organic photodiode (OPD), as an organic solar cell (OSC), or as an organic transistor, for example as an organic thin film transistor (OTFT). In various embodiments, the optoelectronic component may be part of an integrated circuit. Furthermore, a plurality of optoelectronic components may be provided, for example in a manner accommodated in a common housing. The plurality of optoelectronic components may be arranged alongside one another and/or in a manner stacked one above another.

Figure 1:
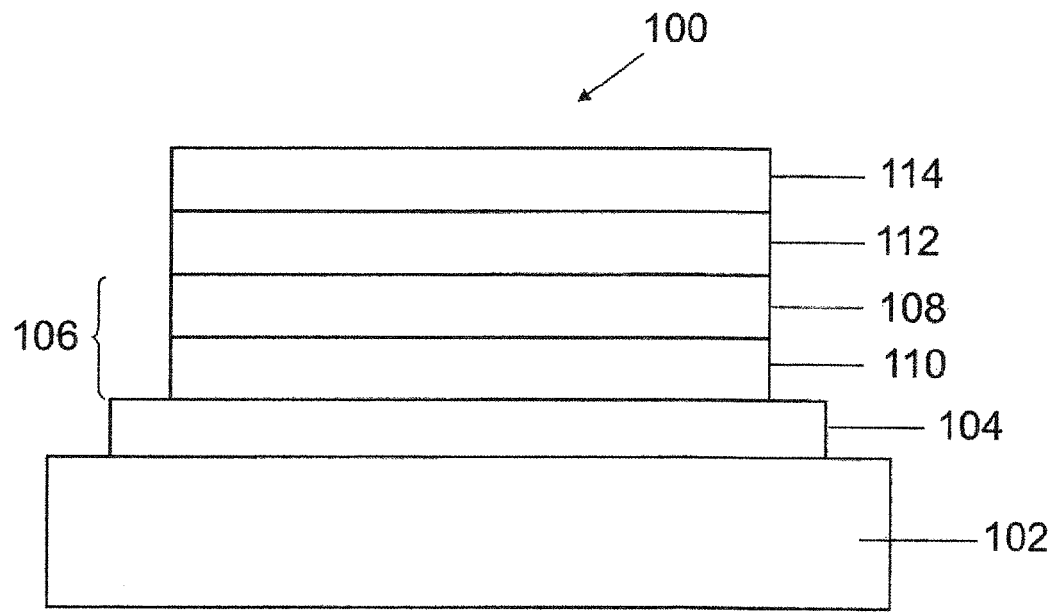
FIG. 1 shows a cross-sectional view of an optoelectronic component unencapsulated and without a cover in accordance with various embodiments.

FIG. 1 shows an organic light emitting diode 100 as an implementation of an optoelectronic component in accordance with various embodiments. The organic light emitting diode 100 in FIG. 1 is still unencapsulated, nor is it yet provided with a cover, for example a protective cover, as will be explained in even greater detail below.

The optoelectronic component 100 in the form of an organic light emitting diode 100 may have a substrate 102. The substrate 102 may serve for example as a carrier element for electronic elements or layers, for example optoelectronic elements. By way of example, the substrate 102 may include or be formed from glass, quartz, and/or a semiconductor material or any other suitable material. Furthermore, the substrate 102 may include or be formed from a plastic film or a laminate including one or including a plurality of plastic films. The plastic may include or be formed from one or more polyolefins (for example high or low density polyethylene (PE) or polypropylene (PP)). Furthermore, the plastic may include or be formed from polyvinyl chloride (PVC), polystyrene (PS), polyester and/or polycarbonate (PC), polyethylene terephthalate (PET), polyether sulfone (PES) and/or polyethylene naphthalate (PEN). Furthermore, the substrate 102 may include for example a metal film, for example an aluminum film, a high-grade steel film, a copper film or a combination or a layer stack thereof. The substrate 102 may include one or more of the materials mentioned above. The substrate 102 may be embodied as translucent, for example transparent, partly translucent, for example partly transparent.

In various embodiments, the term "translucent layer" can be understood to mean that a layer is transmissive to light, for example to the light generated by the optoelectronic component, for example in one or more wavelength ranges, for example to light in a wavelength range of visible light (for example at least in a partial range of the wavelength range of from 380 nm to 780 nm). By way of example, in various embodiments, the term "translucent layer" should be understood to mean that substantially the entire quantity of light coupled into a structure (for example a layer) is also coupled out from the structure (for example layer).

In various embodiments, the term "transparent layer" can be understood to mean that a layer is transmissive to light (for example at least in a partial range of the wavelength range of from 380 nm to 780 nm), wherein light coupled into a structure (for example a layer) is also coupled out from the structure (for example layer) substantially without scattering or light conversion.

A first electrode 104 (for example in the form of a first electrode layer 104) may be applied on or above the substrate 102. The first electrode 104 (also designated hereinafter as bottom electrode 104) may be formed from or be an electrically conductive material, such as, for example, a metal or a transparent conductive oxide (TCO) or a layer stack including a plurality of layers of the same or different metal or metals and/or the same or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs. Furthermore, the TCOs do not necessarily correspond to a stoichiometric composition and can furthermore be p-doped or n-doped. The first electrode 104 can be embodied as an anode, that is to say as a hole-injecting material.

In various embodiments, the first electrode 104 may be formed by a layer stack of a combination of a layer of a metal on a layer of a TCO, or vice versa. One example is a silver layer applied on an indium tin oxide layer (ITO) (Ag on ITO). In various embodiments, the first electrode 104 may include a metal (for example Ag, Pt, Au, Mg) or may include a metal alloy of the materials described (for example an AgMg alloy). In various embodiments, the first electrode 104 may include AlZnO or similar materials.

In various embodiments, the first electrode 104 may include a metal, which can serve for example as cathode material, that is to say as electron-injecting material. In various embodiments, inter alia for example Al, Ba, In, Ag, Au, Mg, Ca or Li and compounds, combinations or alloys of these materials can be provided as cathode material.

In various embodiments, the organic light emitting diode 100 may be designed as a so-called top emitter and/or as a so-called bottom emitter. In various embodiments, a top emitter can be understood to mean an organic light emitting diode in which the light from the organic light emitting diode is emitted toward the top, for example through the second electrode. In various embodiments, a bottom emitter can be understood to mean an organic light emitting diode 100 in which the light from the organic light emitting diode 100 is emitted toward the bottom, for example through the substrate and the first electrode.

A first electrode 104 (for example in the form of a first electrode layer 104) may be applied on or above the substrate 102. The first electrode 104 (also designated hereinafter as bottom electrode 104) may be formed from or be an electrically conductive material, such as, for example, a metal or a transparent conductive oxide (TCO) or a layer stack including a plurality of layers of the same or different metal or metals and/or the same or different TCOs. Transparent conductive oxides are transparent conductive materials, for example metal oxides, such as, for example, zinc oxide, tin oxide, cadmium oxide, titanium oxide, indium oxide, or indium tin oxide (ITO). Alongside binary metal-oxygen compounds, such as, for example, ZnO, $SnO_2$, or $In_2O_3$, ternary metal-oxygen compounds, such as, for example, $AlZnO$, $Zn_2SnO_4$, $CdSnO_3$, $ZnSnO_3$, $MgIn_2O_4$, $GaInO_3$, $Zn_2In_2O_5$ or $In_4Sn_3O_{12}$, or mixtures of different transparent conductive oxides also belong to the group of TCOs. Furthermore, the TCOs do not necessarily correspond to a stoichiometric composition and can furthermore be p-doped or n-doped.

In various embodiments, the first electrode 104 may include a metal; for example Ag, Pt, Au, Mg, Al, Ba, In, Ag, Au, Mg, Ca, Sm or Li, and compounds, combinations or alloys of these materials.

In various embodiments, the first electrode 104 may be formed by a layer stack of a combination of a layer of a metal on a layer of a TCO, or vice versa. One example is a silver layer applied on an indium tin oxide layer (ITO) (Ag on ITO), or ITO-Ag-ITO multilayers.

In various embodiments, the first electrode may provide one or more of the following materials alternatively or additionally to the abovementioned materials: networks of metallic nanowires and nanoparticles, for example composed of Ag; networks of carbon nanotubes; graphene particles and graphene layers; networks of semiconducting nanowires.

Furthermore, these electrodes may include conductive polymers or transition metal oxides or conductive transparent oxides.

For the case where the light emitting component 100 emits light through the substrate, the first electrode 104 and the substrate 102 may be embodied as translucent or transparent. In this case, for the case where the first electrode 104 is formed from a metal, the first electrode 104 may have for example a layer thickness of less than or equal to approximately 25 nm, for example a layer thickness of less than or equal to approximately 20 nm, for example a layer thickness of less than or equal to approximately 18 nm. Furthermore, the first electrode 104 may have for example a layer thickness of greater than or equal to approximately 10 nm, for example a layer thickness of greater than or equal to approximately 15 nm. In various embodiments, the first electrode 104 may have a layer thickness in a range of approximately 10 nm to approximately 25 nm, for example a layer thickness in a range of approximately 10 nm to approximately 18 nm, for example a layer thickness in a range of approximately 15 nm to approximately 18 nm.

Furthermore, for the case of a translucent or transparent first electrode 104 and for the case where the first electrode 104 is formed from a transparent conductive oxide (TCO), the first electrode 104 can have for example a layer thickness in a range of approximately 50 nm to approximately 500 nm, for example a layer thickness in a range of approximately 75 nm to approximately 250 nm, for example a layer thickness in a range of approximately 100 nm to approximately 150 nm.

Furthermore, for the case of a translucent or transparent first electrode 104 and for the case where the first electrode 104 is formed from, for example, a network of metallic nanowires, for example composed of Ag, which can be combined with conductive polymers, a network of carbon nanotubes, which can be combined with conductive polymers, or graphene layers and composites, the first electrode 104 can have for example a layer thickness in a range of approximately 1 nm to approximately 500 nm, for example a layer thickness in a range of approximately 10 nm to approximately 400 nm, for example a layer thickness in a range of approximately 40 nm to approximately 250 nm.

For the case where the light emitting component 100 emits light exclusively toward the top, the first electrode 104 may also be designed as opaque or reflective. In this case, the first electrode 104 can have for example a layer thickness of greater than or equal to approximately 40 nm, for example a layer thickness of greater than or equal to approximately 50 nm.

The first electrode 104 may be embodied as an anode, that is to say as a hole-injecting electrode, or as a cathode, that is to say as electron-injecting.

The first electrode 104 may have a first electrical connection, to which a first electrical potential (provided by an energy source (not illustrated) (for example a current source or a voltage source)) can be applied. Alternatively, the first electrical potential can be or have been applied to the substrate 102 and then be or have been fed via the latter indirectly to the first electrode 104. The first electrical potential can be, for example, the ground potential or some other predefined reference potential.

Furthermore, the optoelectronic component 100 may have an organic functional layer structure 106, which has been or is applied on or above the first electrode 104.

The organic functional layer structure 106 may contain one or a plurality of emitter layers 108, for example including fluorescent and/or phosphorescent emitters, and one or a plurality of hole-conducting layers 110.

Examples of emitter materials which may be used in the optoelectronic component 100 in accordance with various embodiments for the emitter layer(s) 108 include organic or organometallic compounds such as derivatives of polyfluorene, polythiophene and polyphenylene (e.g. 2- or 2,5-substituted poly-p-phenylene vinylene) and metal complexes, for example iridium complexes such as blue phosphorescent FIrPic (bis(3,5-difluoro-2-(2-pyridyl)phenyl-(2-carboxypyridyl)-iridium III), green phosphorescent $Ir(ppy)_3$ (tris(2-phenylpyridine)iridium III), red phosphorescent Ru $(dtb-bpy)_3*2(PF_6)$ (tris[4,4'-di-tert-butyl-(2,2')-bipyridine] ruthenium (III) complex) and blue fluorescent DPAVBi (4,4-bis[4-(di-p-tolylamino)styryl]biphenyl), green fluorescent TTPA (9,10-bis[N,N-di-(p-tolyl)-amino]anthracene) and red fluorescent DCM2 (4-dicyanomethylene)-2-methyl-6-julolidyl-9-enyl-4H-pyran) as non-polymeric emitters. Such non-polymeric emitters may be deposited by means of thermal evaporation, for example. Furthermore, it is possible to use polymer emitters, which may be deposited, in particular, by means of wet-chemical methods such as spin coating or slot dye coating, for example.

The emitter materials may be embedded in a matrix material in a suitable manner.

It should be pointed out that other suitable emitter materials are likewise provided in other embodiments.

The emitter materials of the emitter layer(s) 108 of the optoelectronic component 100 may be selected for example such that the optoelectronic component 100 emits white light. The emitter layer(s) 108 may include a plurality of emitter materials that emit in different colors (for example blue and yellow or blue, green and red); alternatively, the emitter layer(s) 108 may also be constructed from a plurality of partial layers, such as a blue fluorescent emitter layer 108 or blue phosphorescent emitter layer 108, a green phosphorescent emitter layer 108 and a red phosphorescent emitter layer 108. By mixing the different colors, the emission of light having a white color impression can result. Alternatively, provision can also be made for arranging a converter material in the beam path of the primary emission generated by said layers, which converter material at least partly absorbs the primary radiation and emits a secondary radiation having a different wavelength, such that a white color impression results from a (not yet white) primary radiation by virtue of the combination of primary and secondary radiation.

The organic functional layer structure 106 may generally include one or a plurality of functional layers. The one or the plurality of functional layers may include organic polymers, organic oligomers, organic monomers, organic small, non-polymer molecules ("small molecules") or a combination of these materials. By way of example, the organic functional layer structure 106 may include one or a plurality of functional layers embodied as a hole transport layer 110, so as to enable for example in the case of an OLED an effective hole injection into an electroluminescent layer or an electroluminescent region. Alternatively, in various embodiments, the organic electroluminescent layer structure may include one or a plurality of functional layers embodied as an electron transport layer (not illustrated) and/or as an electron injection layer (not illustrated), so as to enable for example in the case of an OLED an effective electron injection into an electroluminescent layer or an electroluminescent region. By way of example, tertiary amines, carbazo derivatives, conductive polyaniline or polyethylene dioxythiophene can be used as material for the hole transport layer 110. In various embodiments, the one or the plurality of functional layers may be embodied as an electroluminescent layer.

In various embodiments, the hole transport layer 110 may be applied, for example deposited, on or above the first electrode 104, and the emitter layer 108 may be applied, for example deposited, on or above the hole transport layer 110.

In various embodiments, the organic functional layer structure 106 (that is to say for example the sum of the thicknesses of the hole transport layer(s) 110 and emitter layer(s) 108) may have a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various embodiments, the organic functional layer structure 106 may have for example a stack of a plurality of organic light emitting diodes (OLEDs) arranged directly one above another, wherein each OLED can have for example a layer thickness of a maximum of approximately 1.5 µm, for example a layer thickness of a maximum of approximately 1.2 µm, for example a layer thickness of a maximum of approximately 1 µm, for example a layer thickness of a maximum of approximately 800 nm, for example a layer thickness of a maximum of approximately 500 nm, for example a layer thickness of a maximum of approximately 400 nm, for example a layer thickness of a maximum of approximately 300 nm. In various exemplary embodiments, the organic functional layer structure 106 can have for example a stack of three or four OLEDs arranged directly one above another, in which case for example the organic functional layer structure 106 may have a layer thickness of a maximum of approximately 3 µm.

The optoelectronic component 100 may optionally generally include further organic functional layers, for example arranged on or above the one or the plurality of emitter layers 108, that serve to further improve the functionality and thus the efficiency of the optoelectronic component 100.

A second electrode 112 (for example in the form of a second electrode layer 112) may be applied on or above the organic functional layer structure 106 or if appropriate on or above the one or the plurality of further organic functional layers.

In various embodiments, the second electrode 112 may include or be formed from the same materials as the first electrode 104, metals being particularly suitable in various embodiments.

In various embodiments, the second electrode 112 may have for example a layer thickness of less than or equal to approximately 50 nm, for example a layer thickness of less than or equal to approximately 45 nm, for example a layer thickness of less than or equal to approximately 40 nm, for example a layer thickness of less than or equal to approximately 35 nm, for example a layer thickness of less than or equal to approximately 30 nm, for example a layer thickness of less than or equal to approximately 25 nm, for example a layer thickness of less than or equal to approximately 20 nm, for example a layer thickness of less than or equal to approximately 15 nm, for example a layer thickness of less than or equal to approximately 10 nm.

The second electrode 112 may generally be or have been embodied in a similar manner to the first electrode 104, or differently than the latter. In various embodiments, the second electrode 112 may have been or be formed from one or a plurality of the materials and with the respective layer thickness (depending on whether the second electrode is intended to be embodied as reflective, translucent or transparent) as described above in connection with the first electrode 104.

In various embodiments, the second electrode 112 (which can also be designated as top contact 112) may be embodied as semitransparent or transparent.

In various embodiments, the second electrode 112 can, however, have an arbitrarily greater layer thickness, for example a layer thickness of at least 1 if the second electrode 112 is embodied as semitransparent or transparent.

The second electrode 112 may have a second electrical connection, to which a second electrical potential (which is different than the first electrical potential), provided by the energy source, can be applied. The second electrical potential may have for example a value such that the difference with respect to the first electrical potential has a value in a range of approximately 1.5 V to approximately 20 V, for example a value in a range of approximately 2.5 V to approximately 15 V, for example a value in a range of approximately 5 V to approximately 10 V.

In various embodiments, a mirror layer structure 114 is applied on or above the second electrode 112.

In various embodiments, the mirror layer structure 114 has a layer thickness of at least 1 μm.

In various embodiments, the mirror layer structure 114 may include one or a plurality of metal films.

The one or the plurality of metal films of the mirror layer structure 114 can (in each case) have a layer thickness in a range of approximately 5 nm to approximately 5000 nm, for example a layer thickness in a range of approximately 15 nm to approximately 1000 nm, for example a layer thickness in a range of approximately 50 nm to approximately 300 nm, such that the mirror layer structure 114 has a total layer structure thickness in a range of approximately 10 nm to approximately 5000 nm, for example a layer thickness in a range of approximately 15 nm to approximately 1000 nm, for example a layer thickness in a range of approximately 50 nm to approximately 300 nm.

For this case, it is possible to use for the mirror layer structure 114 all those materials such as have been mentioned above for the second electrode 112. Thus, by way of example, doped metal-oxidic compounds such as ITO, IZO or AZO can also be provided, which may be deposited by means of a low-damage deposition technology, such as, for example, by means of "facial target sputtering".

The mirror layer structure 114 may include one or a plurality of mirrors. If the mirror layer structure 114 includes a plurality of mirrors, then the respective mirrors are separated from one another by means of a respective dielectric layer.

In various embodiments, the mirror layer structure 114 may also be omitted and its functionality may be provided by the second electrode 112.

Additional layers for example for improving the adhesion and/or the processability can be provided in various embodiments.

Furthermore, the organic light emitting diode 100 may also include one or a plurality of encapsulation layers (not illustrated), for example one or a plurality of thin-film encapsulation layers, which can be applied for example in the context of a back end of line process.

In various embodiments, the light is emitted through the optically translucent, for example optically transparent, bottom contact (also designated as first electrode) of the optoelectronic component, for example the OLED (in this case, the optoelectronic component is designed as a "bottom emitter").

Figure 2:
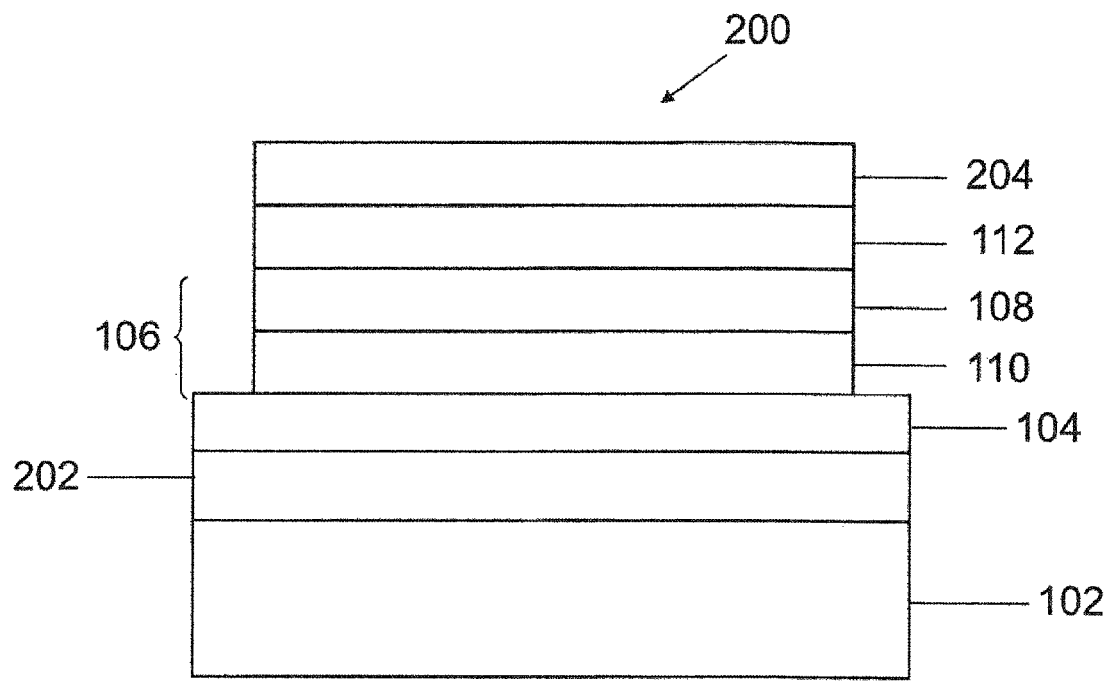
FIG. 2 shows a cross-sectional view of an optoelectronic component unencapsulated and without a cover in accordance with various embodiments.

FIG. 2 shows an organic light emitting diode 200 as an implementation of an optoelectronic component in accordance with various embodiments.

The organic light emitting diode 200 in accordance with FIG. 2 is identical to the organic light emitting diode 100 in accordance with FIG. 1 in many aspects, for which reason, only the differences between the organic light emitting diode 200 in accordance with FIG. 2 and the organic light emitting diode 100 in accordance with FIG. 1 will be explained in greater detail below; with regard to the remaining elements of the organic light emitting diode 200 in accordance with FIG. 2, reference is made to the above explanations concerning the organic light emitting diode 100 in accordance with FIG. 1.

In contrast to the organic light emitting diode 100 in accordance with FIG. 1, in the case of the organic light emitting diode 200 in accordance with FIG. 2, the mirror layer structure 202 is not formed on or above the second electrode 112, but rather below the first electrode 104.

In these embodiments, the energy source is connected to the first electrical connection of the first electrode 104 and to the second electrical connection of the second electrode 112.

The organic light emitting diode 200 in accordance with FIG. 2 may have been or be embodied as a top emitter.

In various embodiments, the organic light emitting diode 200 in accordance with FIG. 2 is illustratively a surface emitting OLED. Both contacts (i.e. the first electrode 104 and the second electrode 112) are semitranslucent, for example semitransparent, in this embodiment.

Furthermore, in the organic light emitting diode 200 in accordance with FIG. 2, an encapsulation layer structure 204, for example in the form of a thin-film encapsulation 204, is arranged on or above the second electrode 112.

Figure 3:
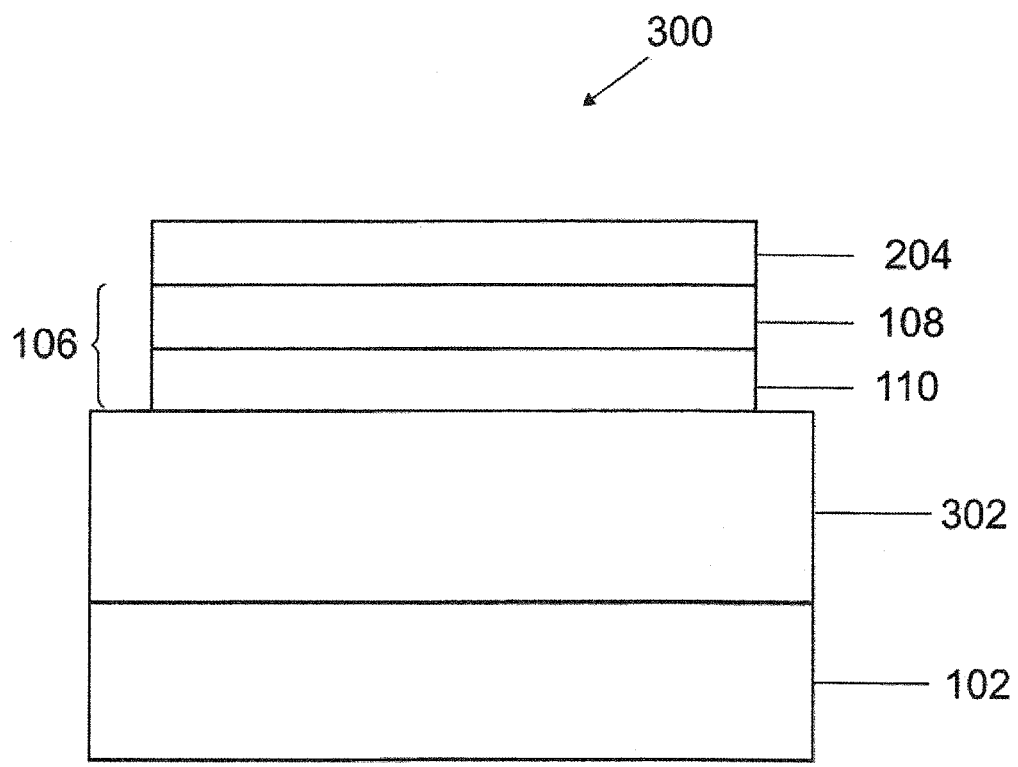
FIG. 3 shows a cross-sectional view of an optoelectronic component unencapsulated and without a cover in accordance with various embodiments.

Consequently, in various embodiments, illustratively the optoelectronic component that emits on the substrate side (for example the OLED that emits on the substrate side) is transposed to an optoelectronic component that emits on the surface side (for example an OLED that emits on the surface side), as illustrated in FIG. 2 or FIG. 3. In this case, the external metal mirror can be or have been arranged below the optically translucent, for example transparent, bottom contact. In this case, the light leaves the OLED for example through the optically translucent, for example transparent, top contact (for example the second electrode), and is thus embodied for example as a top emitter.

In various embodiments, the mirror layer structure, for example the thick metal mirror, can be applied directly to the substrate 102 and at the same time form the lower contact, i.e. the first electrode 302 of the optoelectronic component 300, for example of an OLED 300. Such an optoelectronic component 300 is illustrated in FIG. 3.

The remaining layer stack of the optoelectronic component 300 in accordance with FIG. 3 is identical to the layer stack of the optoelectronic component 200 in accordance with FIG. 2.

It should be pointed out that, in the context of alternative embodiments, the organic light emitting diode may also have any other suitable construction desired.

FIG. 4A to FIG. 4F show the optoelectronic component 100 according to various embodiments at different points in time during its production. The other optoelectronic components 200, 300 can be produced in a corresponding manner.

Figure 4A:
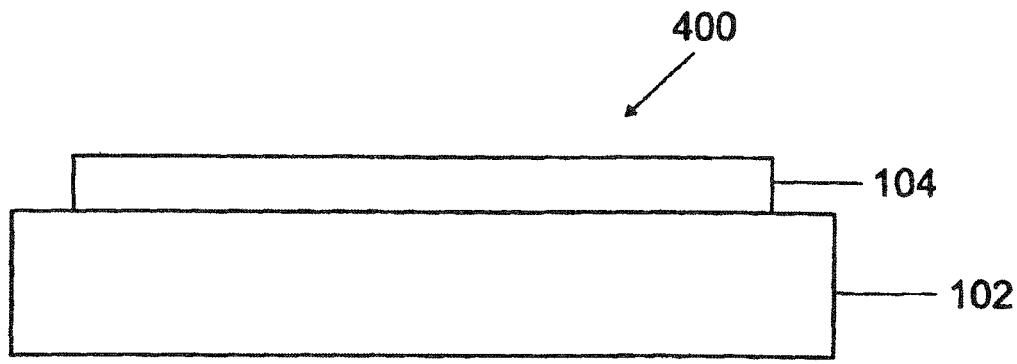
FIGS. 4A to 4E show cross-sectional views of the optoelectronic component in accordance with FIG. 1 at different points in time during the production thereof.

FIG. 4A shows the optoelectronic component 100 at a first point in time 400 during its production.

At this point in time, the first electrode 104 is applied to the substrate 102, for example deposited, for example by means of a CVD method (chemical vapor deposition) or by means of a PVD method (physical vapor deposition, for example sputtering, ion assisted deposition method or thermal evaporation), alternatively by means of a plating method; a dip coating method; a spin coating method; printing; blade coating; or spraying.

In various embodiments, a plasma enhanced chemical vapor deposition (PE-CVD) method may be used as CVD method. In this case, a plasma may be generated in a volume above and/or around the element to which the layer to be applied is intended to be applied, wherein at least two gaseous starting compounds are fed to the volume, said compounds being ionized in the plasma and excited to react with one another. The generation of the plasma may make it possible that the temperature to which the surface of the element is to be heated in order to make it possible to produce the dielectric layer, for example, may be lowered in comparison with a plasmaless CVD method. That may be advantageous, for example, if the element, for example the light emitting electronic component to be formed, would be damaged at a temperature above a maximum temperature. In the case of a light emitting electronic component to be formed in accordance with various embodiments, the maximum temperature may be approximately 120° C., such that the temperature at which for example the dielectric layer is applied can be less than or equal to 120° C. and for example less than or equal to 80° C.

Figure 4B:
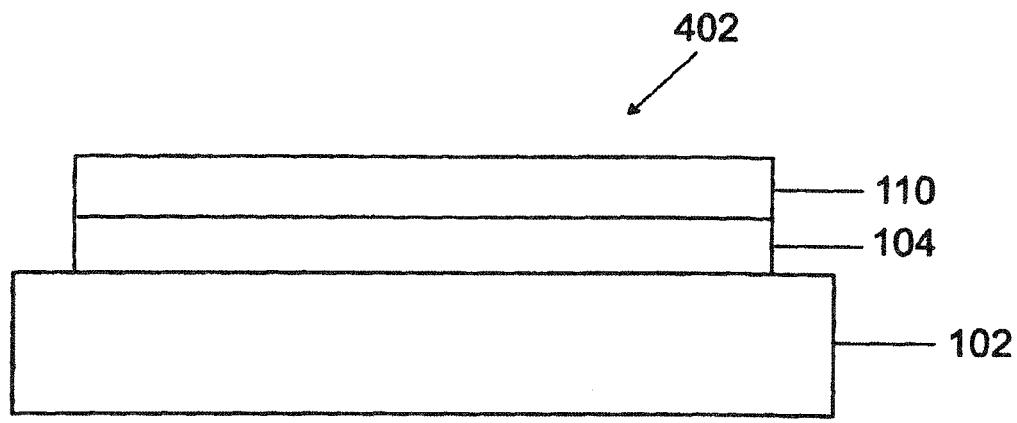

FIG. 4B shows the optoelectronic component 100 at a second point in time 402 during its production.

At this point in time, the one or the plurality of hole conduction layers 110 is or are applied to the first electrode 104, for example deposited, for example by means of a CVD method (chemical vapor deposition) or by means of a PVD method (physical vapor deposition, for example sputtering, ion assisted deposition method or thermal evaporation), alternatively by means of a plating method; a dip coating method; a spin coating method; printing; blade coating; or spraying.

Figure 4C:
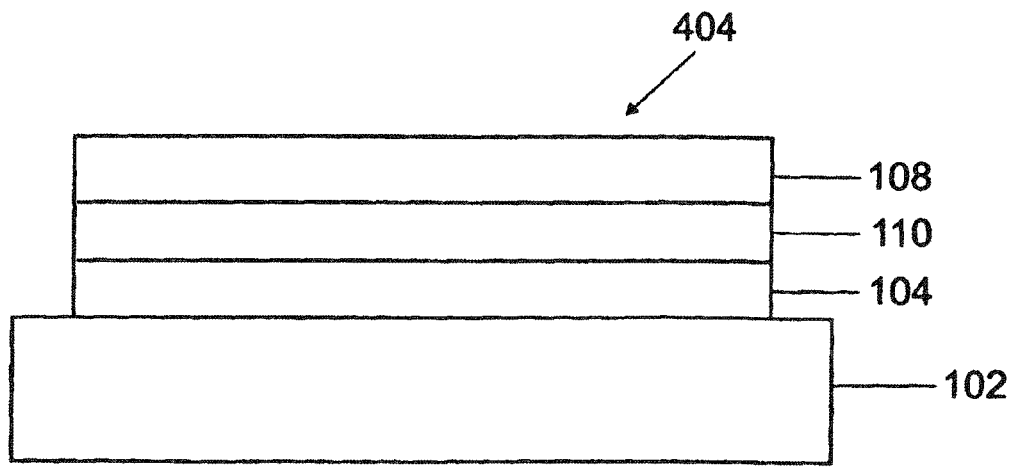

FIG. 4C shows the optoelectronic component 100 at a third point in time 404 during its production.

At this point in time, the one or the plurality of emitter layers 108 is or are applied to the one or the plurality of hole conduction layers 110, for example deposited, for example by means of a CVD method (chemical vapor deposition) or by means of a PVD method (physical vapor deposition, for example sputtering, ion assisted deposition method or thermal evaporation), alternatively by means of a plating method; a dip coating method; a spin coating method; printing; blade coating; or spraying.

Figure 4D:
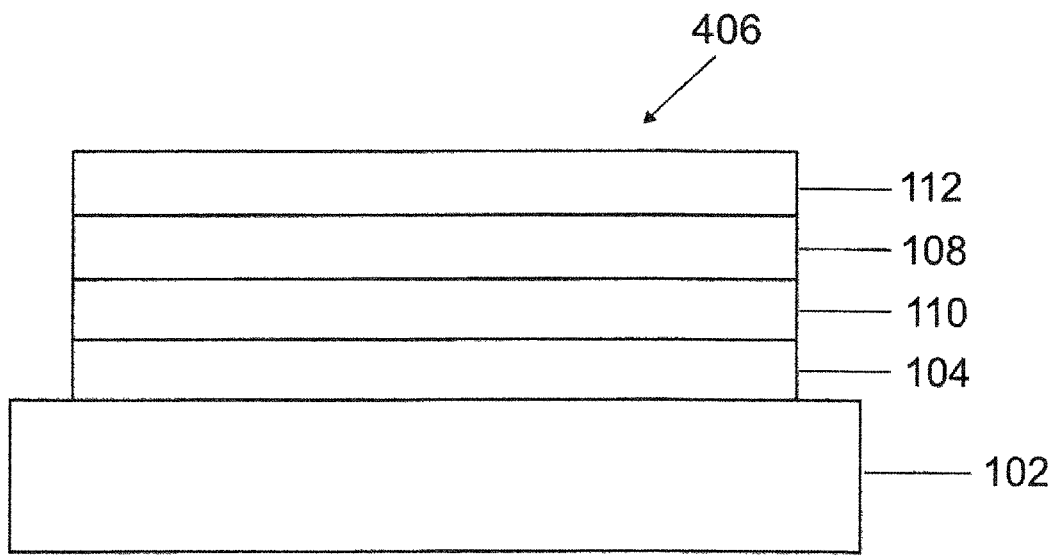

FIG. 4D shows the optoelectronic component 100 at a fourth point in time 406 during its production.

At this point in time, the second electrode 112 is applied to the one or the plurality of further organic functional layers (if present) or to the one or the plurality of emitter layers 108, for example deposited, for example by means of a CVD method (chemical vapor deposition) or by means of a PVD method (physical vapor deposition, for example sputtering, ion assisted deposition method or thermal evaporation), alternatively by means of a plating method; a dip coating method; a spin coating method; printing; blade coating; or spraying.

Figure 4E:
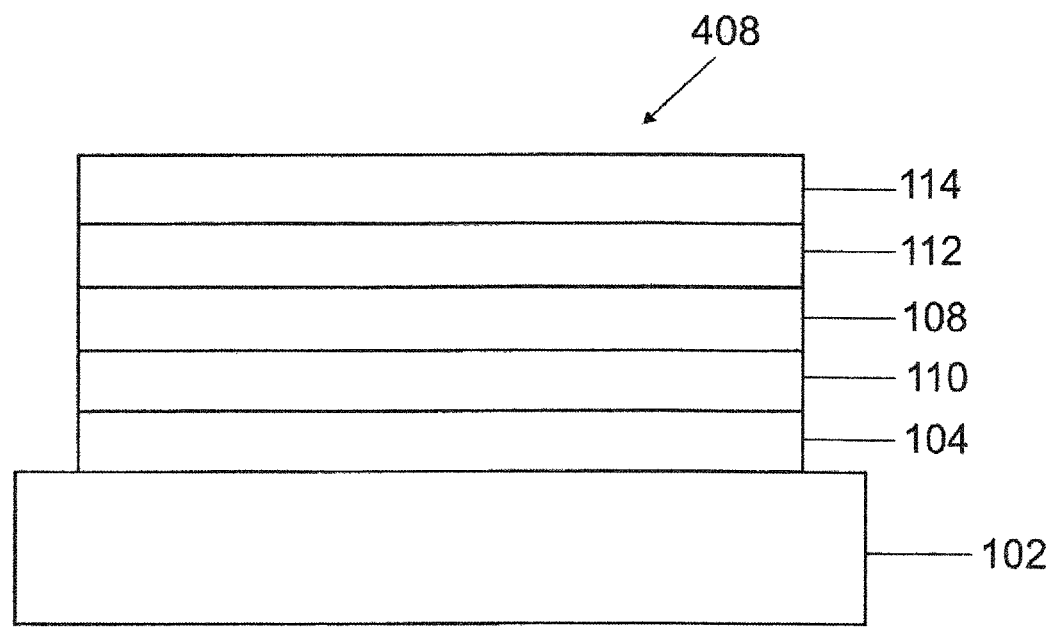

FIG. 4E shows the optoelectronic component 100 at a fifth point in time 408 during its production.

At this point in time, the mirror layer structure 114 having the lateral thermal conductivity described above is applied to the second electrode 112, for example by means of a CVD method (chemical vapor deposition) or by means of a PVD method (physical vapor deposition, for example sputtering, ion assisted deposition method or thermal evaporation), alternatively by means of a plating method; a dip coating method; a spin coating method; printing; blade coating; or spraying.

Figure 5:
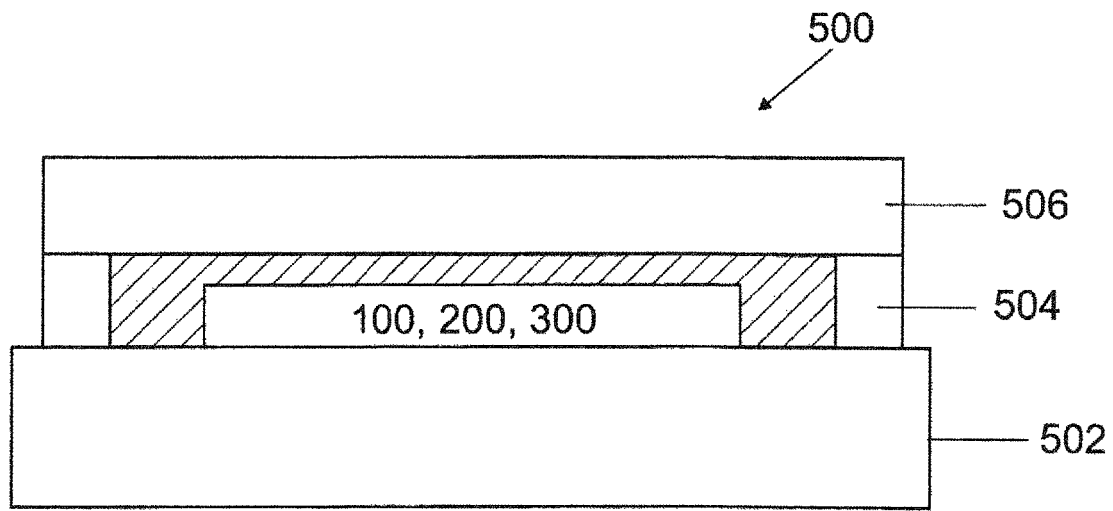
FIG. 5 shows a cross-sectional view of an optoelectronic component with a cover in accordance with various embodiments.

FIG. 5 shows a cross-sectional view of an optoelectronic component 500 with a cover in accordance with various embodiments.

As illustrated in FIG. 5, in the various embodiments, the optoelectronic component 500 may include a carrier 502, for example a substrate 502. The carrier 502 may include an arbitrary, for example electrically insulating, material. In various embodiments, the carrier 502 may also be formed by the substrate 102. In various embodiments, the carrier 502 may be formed from the materials such as have been described above in connection with the substrate 102.

The (still incomplete) optoelectronic component (if appropriate already provided with a thin-film encapsulation), for example the organic light emitting diode 100, 200, 300, is applied on the carrier 502, for example fixed, for example adhesively bonded or deposited thereon.

In various embodiments, a cover 506, for example a glass cover 506, is fixed by means of an adhesive 504, for example adhesively bonded, for example laminated, on the (still incomplete) optoelectronic component, for example on the organic light emitting diode 100, 200, 300. Consequently, illustratively the adhesive 504 is applied on the organic light emitting diode 100, 200, 300, for example on an upper exposed layer of the organic light emitting diode 100, 200, 300, and the cover 506 is applied, for example placed, on the adhesive 504. In various embodiments, the cover may be formed by an electrically insulating film, for example a plastic film, an electrically conductive film, for example a metal film, or the like.

In various embodiments, the adhesive 504 may include or consist of one or a plurality of the following materials: polymeric materials consisting for example of epoxy resins, acrylates, fluoropolymers, perfluoropolyethers, PFPE (meth) acrylates, silicones, polymethyl methacrylate (PMMA), MMA+PMMA, ethylene vinyl acetate (EVA), polyester, polyurethanes, or the like.

The adhesive 504, as it is applied, is initially liquid, for example gel-like or jelly-like, and has a viscosity in a range of approximately 0.001 Pa*s to 3000 Pa*s, for example in a range of approximately 1 Pa*s to 500 Pa*s, for example in a range of approximately 20 Pa*s to 60 Pa*s (wherein the values indicated are typical values at room temperature). Later, a part of the adhesive 504 or the entire adhesive 504 (for example if the adhesive is situated only in the partial region, and for example the inner region, which will be explained in even greater detail below, is filled with a different material) is altered in terms of its viscosity, for example cured, for example laminated, as will be explained in even greater detail below.

Figure 7A:
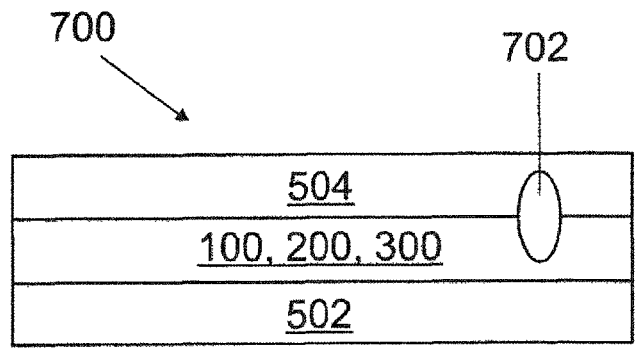
FIGS. 7A to 7C show basic cross-sectional views by means of which possible damage to an optoelectronic component during the conventional curing of the adhesive over the whole area is illustrated.
Figure 7B:
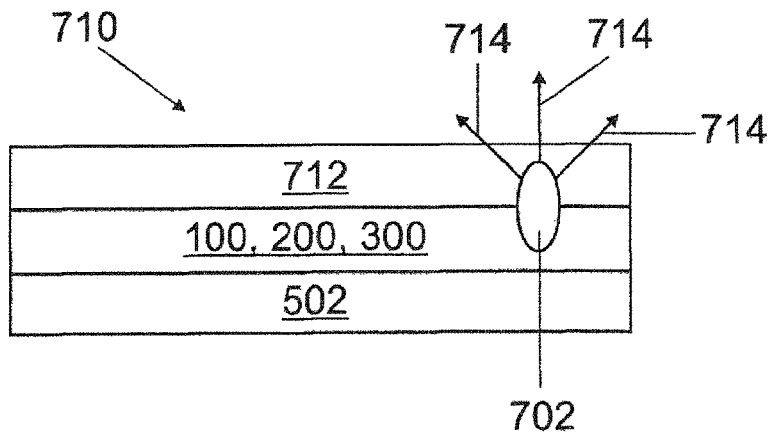
Figure 7C:
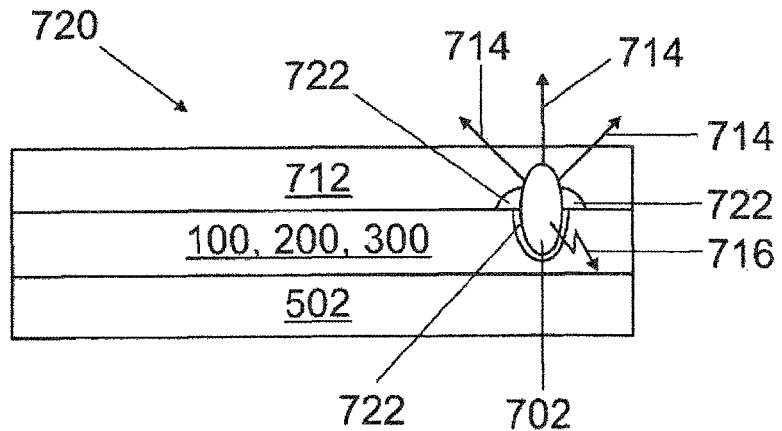

For example in the context of a lamination process provided in various embodiments, the cover 506, for example a glass cover 506, is laminated (for example over the whole area) onto the organic light emitting diode 100, 200, 300, for example onto the rear side thereof. For the purpose of curing the adhesive 504, the adhesive 504 is applied over the whole area to the organic light emitting diode 100, 200, 300 and conventionally exposed over the whole area with ultraviolet radiation (see FIG. 7A to FIG. 7C). The adhesive 504 is polymerized, for example, during this process. In this case, the adhesive 504 generally contracts by a few percent or expands accordingly, depending on the adhesive 504 used. However, this process can induce mechanical stresses at the interface between the organic light emitting diode 100, 200, 300 (for example including its thin-film encapsulation possibly provided) and the adhesive 504. Embedded particles may thus be pressed into or torn out of the organic light emitting diode 100, 200, 300, for example. During the operation of the organic light emitting diode 100, 200, 300, this can lead to the short-circuiting of the entire optoelectronic component. If the materials expand differently during operation, then this may lead to a similar behavior. FIG. 7A shows, in a first view 700, the not yet cured adhesive 504, particles 702 being contained in the adhesive 504 and/or in the organic light emitting diode 100, 200, 300. FIG. 7A shows, in a second view 710, the adhesive 712 cured by means of whole-area UV exposure, said adhesive contracting or expanding on account of the UV exposure. This gives rise to mechanical stresses at the interface between the organic light emitting diode 100, 200, 300 and the adhesive 712 which act on the particles 702 (symbolized by means of arrows 714 in FIG. 7B). During operation, the organic light emitting diode 100, 200, 300 heats up and in turn induces mechanical stresses. Organic material may be torn out of the organic light emitting diode 100, 200, 300 or be pressed into the organic light emitting diode 100, 200, 300 (symbolized in FIG. 7C, in a third view 720, with a region 722 of increased mechanical loading), which can lead to a short circuit or else to a delamination for example of the encapsulation layer(s), symbolized by a lightning symbol 716.

Figure 6:
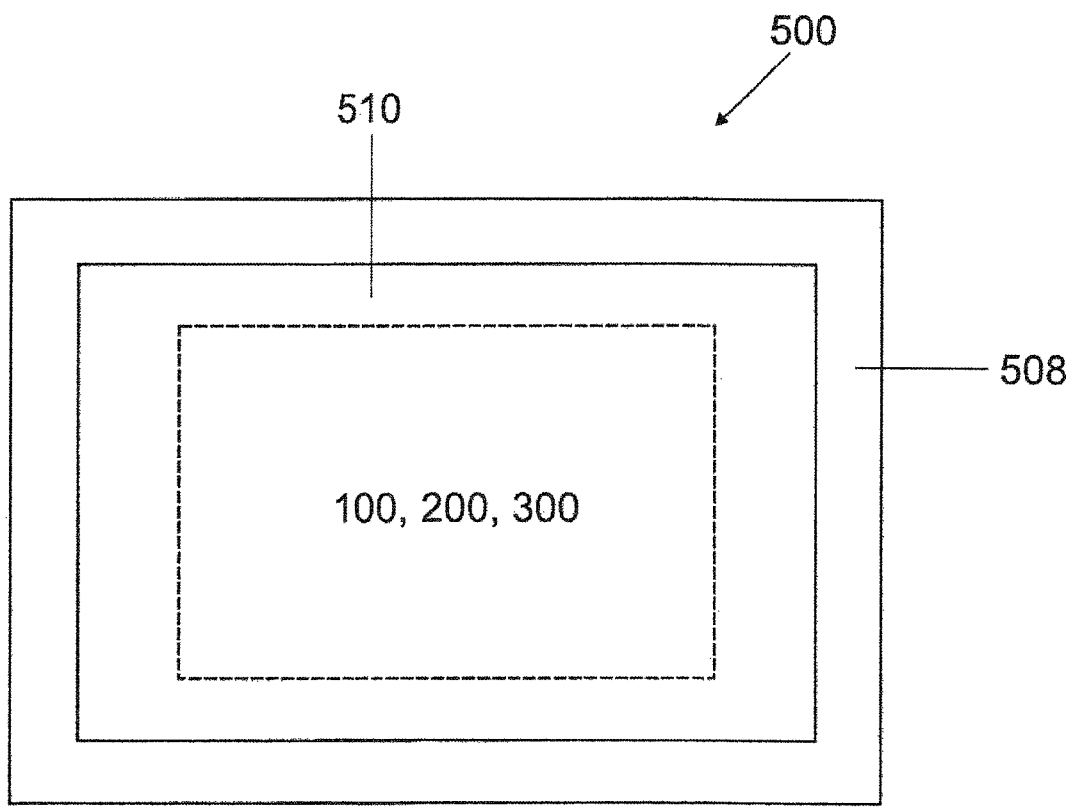
FIG. 6 shows a plan view of the optoelectronic component in accordance with FIG. 5.

Referring to FIG. 5 again, in the case of the optoelectronic component 500, the adhesive 504 is cured only in a partial region above the substrate 502 and/or above the organic light emitting diode 100, 200, 300, for example above the layer. In various embodiments, the partial region is a region above the carrier 502 alongside the organic light emitting diode 100, 200, 300. In this case, illustratively for example an edge region 508 of the adhesive 504 is cured, whereas an inner region 510 of the adhesive 504, said inner region being substantially completely enclosed by the edge region 508 of the adhesive 504, remains substantially unchanged in terms of its viscosity and thus still remains embodied as liquid, for example gel-like or jelly-like (see, for example, the plan view of FIG. 6, in which the cover 506 is not shown). The organic light emitting diode 100, 200, 300 illustrated by dashed lines symbolizes that it is completely covered by the adhesive 504. Illustratively, in various embodiments, the edge region 508 of the adhesive 504 may include a circumferential region of the adhesive 504 or be formed thereby.

It should be noted that, in various embodiments, the edge region 510 may extend laterally as far as the edge of the organic light emitting diode 100, 200, 300, such that no liquid adhesive 504 is situated alongside the organic light emitting diode 100, 200, 300, rather directly the cured part of the adhesive 504 is laterally adjacent to the organic light emitting diode 100, 200, 300.

Furthermore, in various embodiments, it may be provided that the edge region extends partly or completely also above the organic light emitting diode 100, 200, 300 and thus above the active region of the optoelectronic component 500, wherein, however, an inner region above the organic light emitting diode 100, 200, 300 and thus above the active region of the optoelectronic component 500 has adhesive 504 which remains substantially unchanged in terms of its viscosity and thus still remains embodied as liquid, for example gel-like or jelly-like.

Consequently, illustratively in various embodiments, although the adhesive 504 is applied over the whole area to the carrier 502 and/or the organic light emitting diode 100, 200, 300 and/or the cover 506, only a partial region of the adhesive 504, for example above an edge region of the optoelectronic component 500, for example the edge region 510 (for example outside the active area of the optoelectronic component 500) is cured, for example exposed, for example exposed by means of UV light. However, it is also possible to use light in a different wavelength range for curing the adhesive 504, for example light having even shorter wavelengths. It should be pointed out that, in alternative embodiments, other methods for curing the adhesive 504 in the partial region can likewise be used, for example local heating by means of an electrical heat source (not illustrated). As a result of the local curing of the adhesive only in a partial region above the substrate or the organic light emitting diode 100, 200, 300, the adhesive 504 maintains its gel-like or jelly-like consistency outside the partial region in which the adhesive 504 is cured, for example in the active region of the optoelectronic component 500.

Illustratively, FIG. 5 shows an optoelectronic component 500, for example an OLED 500, with glass lamination and non-cured adhesive in the active region of the optoelectronic component 500, for example of the OLED 500. In an edge region of the adhesive 504, the adhesive 504 is cured and thus establishes the (adhesive-bonding connection between the carrier 502 and the cover 506, for example the cover glass 506. Slipping of the cover 506, for example of the cover glass 506, relative to the carrier 502 is thus prevented.

Particles 802 which are situated in the adhesive 504 or which were already introduced into the organic light emitting diode 100, 200, 300 during the vapor deposition of the individual layers of the organic light emitting diode 100, 200, 300 now, in accordance with various embodiments, are no longer pressed into or withdrawn from the organic light emitting diode 100, 200, 300.

Figure 8A:
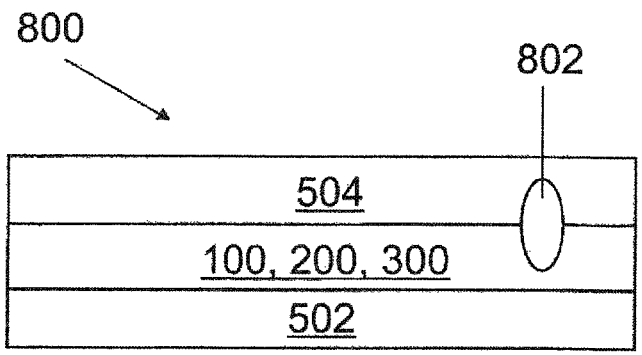
FIGS. 8A to 8C show basic cross-sectional views by means of which lamination of an optoelectronic component with curing of the adhesive only in a partial region in accordance with various embodiments is illustrated.
Figure 8B:
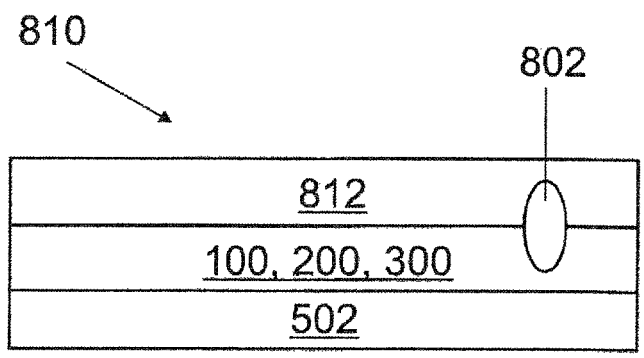
Figure 8C:
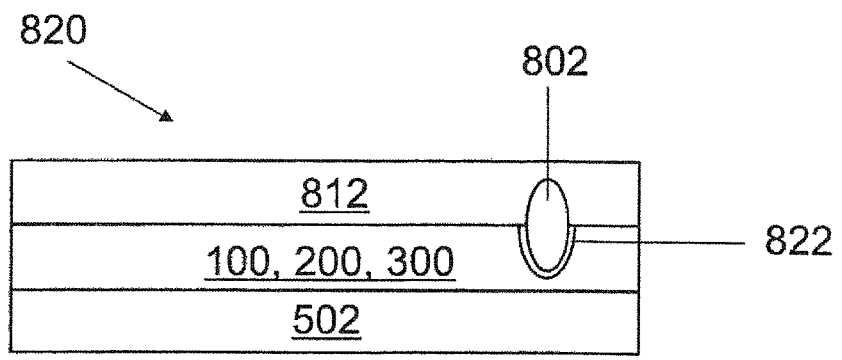

FIG. 8A to FIG. 8C show basic cross-sectional views by means of which lamination of an optoelectronic component with curing of the adhesive only in a partial region in accordance with various embodiments is illustrated. As is illustrated in a first view 800 in FIG. 8A, for the purpose of locally curing the adhesive 504, the adhesive 504 is applied to the organic light emitting diode 100, 200, 300 over the whole area and is cured over the whole area only in a partial region, for example exposed with ultraviolet radiation (see second view 810 in FIG. 8B), wherein the partial region shown in FIG. 8B is not cured and thus remains substantially unchanged in terms of its viscosity (designated by 812 in FIG. 8B). The adhesive 504 is polymerized in the exposed partial region, for example, during this process. In this case, the adhesive 504 generally contracts by a few percent in the exposed partial region or expands accordingly, depending on the adhesive 504 used. Since the region 812 of the adhesive 504 illustrated in FIG. 8B is not cured, however, no or at least only reduced mechanical stresses occur therein in comparison with the conventional procedure. Consequently, embedded particles 802 are likewise subjected to no or only reduced mechanical stresses. During the operation of the organic light emitting diode 100, 200, 300 even for the case where the particles 802 are torn out of the organic light emitting diode 100, 200, 300, the still liquid part 812 of the adhesive 504 may flow into the resultant material gap (also designated as defect location 822, see third view 820 in FIG. 8C) and fill the latter. Since the adhesive 504 is embodied as electrically insulating in various embodiments, the adhesive 504 illustratively smothers or insulates the defect location 822. A type of halo in which less adhesive material is present arises around it.

As a result of the liquid, for example gel-like or jelly-like, medium in the inner region 510, for example in the active region of the optoelectronic component, the heat that arises at a hotspot that is already present can be better dissipated toward the outside since the medium is movable (liquid) and a better heat exchange can thus take place (possibly also by means of convection). Moreover, in accordance with various embodiments, a delamination of the cover 506, for example of the glass cover 506, also designated as cover glass 506, at the short-circuited locations is prevented, which, with cured adhesive 504, would generally be caused by the abrupt evaporation of the materials at the short-circuited locations. In accordance with various embodiments, the region of the delamination is (significantly) larger than the actual short-circuit region. This has the disadvantage in the case of transparent components, for example, that such delamination locations both adversely influence the appearance of the optoelectronic component, for example of an OLED, in the switched-off state and lead to large-area (for example in a range of a few cm$^2$) non-luminous regions in the switched-on state.

Figure 9:
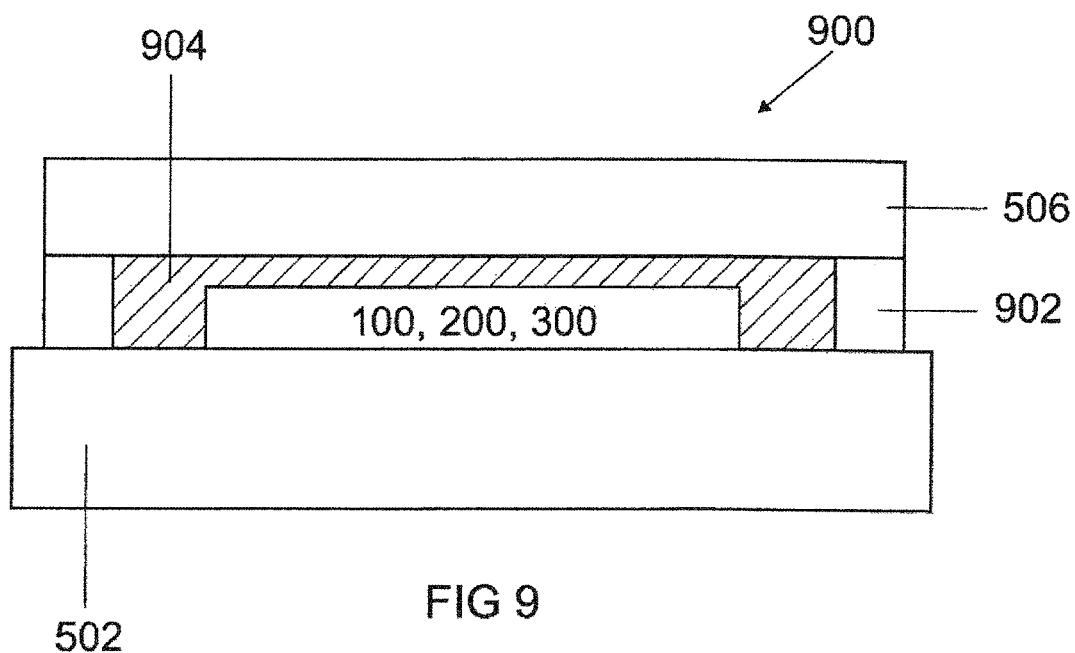
FIG. 9 shows a cross-sectional view of an optoelectronic component with a cover in accordance with various embodiments.
Figure 10:
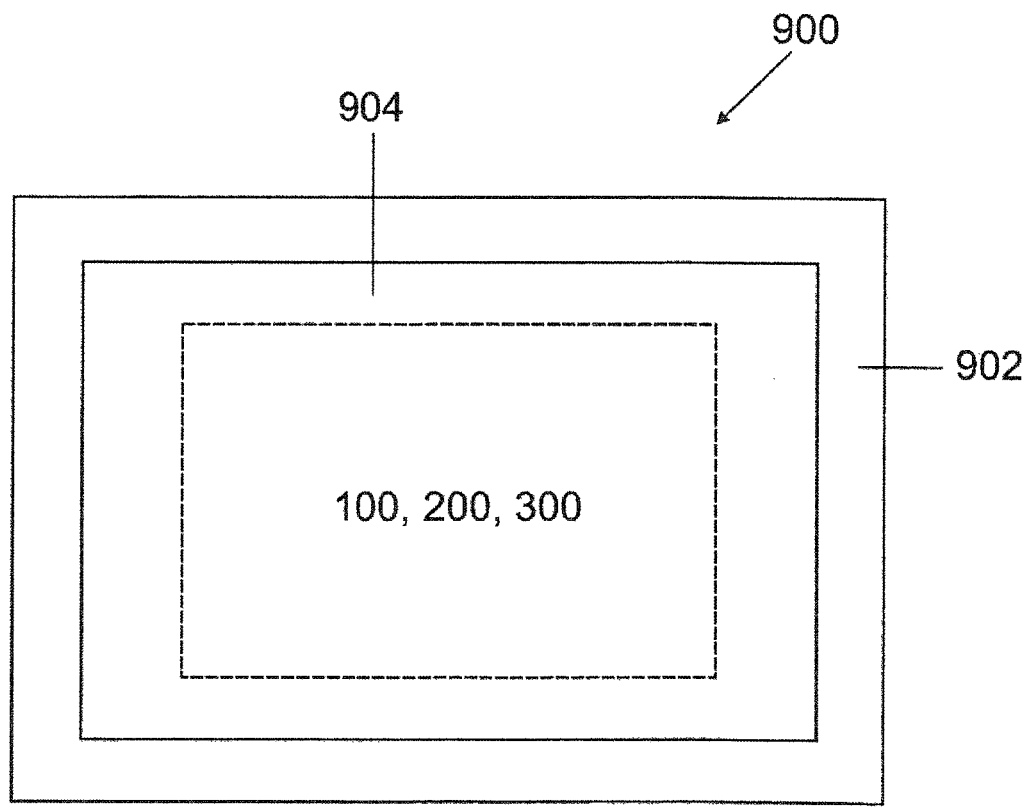
FIG. 10 shows a plan view of the optoelectronic component in accordance with FIG. 9.

FIG. 9 shows a cross-sectional view of an optoelectronic component 900 with a cover in accordance with various embodiments; and FIG. 10 shows a plan view of the optoelectronic component 900 in accordance with FIG. 9.

In various embodiments, provision can be made for using not just one adhesive 504, but rather a plurality of different adhesives 902, 904 having mutually different viscosities, for example. In various exemplary embodiments, the adhesives 902, 904 can have different curing properties, such that they are selectively curable, for example; thus, by way of example, a first adhesive 902 can already cure upon irradiation with light having a wavelength or energy for which a second adhesive 904 does not yet cure. Thus, by way of example (even without an exposure mask) the first adhesive 902 can be cured and the second adhesive 904 can remain substantially unchanged in terms of its viscosity, but in any case not yet fully cured. In various embodiments, the first adhesive 902 is arranged in a partial region above the carrier 502, for example in an edge region of the carrier 502 or the cover 506, and encloses for example the second adhesive 904 laterally, such that the cured first adhesive 902 illustratively forms a receptacle region for receiving the (not (fully) cured) second adhesive 904. It should be pointed out that, in an alternative configuration, also only a part of the first adhesive 902 can be fully cured and/or also a part of the second adhesive 904 can be fully cured.

In various embodiments, the first adhesive 902 may include or consist of one or a plurality of the following materials: polymeric materials consisting for example of epoxy resins, acrylates, fluoropolymers, perfluoropolyethers, PFPE (meth) acrylates, silicones, polymethyl methacrylate (PMMA), MMA+PMMA, ethylene vinyl acetate (EVA), polyester, polyurethanes, or the like. Furthermore, in various exemplary embodiments, the second adhesive 904 may include or consist of one or a plurality of the following materials: polymeric materials consisting for example of epoxy resins, acrylates, fluoropolymers, perfluoropolyethers, PFPE (meth)acrylates, silicones, polymethyl methacrylate (PMMA), MMA+PMMA, ethylene vinyl acetate (EVA), polyester, polyurethanes, or the like.

Consequently, in various embodiments, it is possible to combine different materials (for example different adhesives) for the adhesive region for example at the edge of the optoelectronic component and as "filling material" in the inner region of the optoelectronic component, for example in the active region of the optoelectronic component. Thus, by way of example, it is possible to form the first adhesive 902 at the edge by a dispersion process, and the second adhesive 904 in the inner region of the optoelectronic component, for example in the active region of the optoelectronic component, for example having a different viscosity, can be applied by means of a printing process, for example.

Alternatively, instead of the second adhesive 904, some other liquid, for example gel-like or jelly-like material can be provided, for example a gel, generally a liquid, oil, silicone, etc., can be provided in the inner region of the optoelectronic component, for example in the active region of the optoelectronic component, for example in a manner enclosed by the first adhesive 902.

Consequently, in the inner region of the optoelectronic component, for example in the active region of the optoelectronic component, a material can be introduced which cannot be cured by means of light (for example cannot be cured by means of UV light), generally not in the manner in which the first adhesive 902 is cured, as a result of which a later curing of the second adhesive 904 or of the liquid material provided as an alternative thereto is prevented during later operation.

In various embodiments, in the inner region, generally outside the partial region in which the adhesive 504, 902 is or has been cured, for example in the active region, scattering particles or scattering materials can be provided in a suitable manner. In various exemplary embodiments, the cover 506 is then fixed to the edge region by means of the cured adhesive 504, 902, illustratively by the adhesive edge formed. By virtue of the scattering particles, the light can be scattered within this layer, and can thereby be coupled out more effectively.

Furthermore, in various embodiments, provision is made for using a liquid, for example an oil, or a silicone, etc., having a lower refractive index in the inner region of the optoelectronic component, for example in the active region of the optoelectronic component. In connection with a cover embodied with a specific structure, for example a cover glass embodied with a specific structure, in various exemplary embodiments, in this way the emission profile of the optoelectronic component, for example of the ° LED, can be varied and for example set in a targeted manner. In this case, the cover embodied with a specific structure, for example the cover glass embodied with a specific structure, can have a higher refractive index than the liquid, for example the oil, or the silicone, etc.

Figures 11A, 11B:
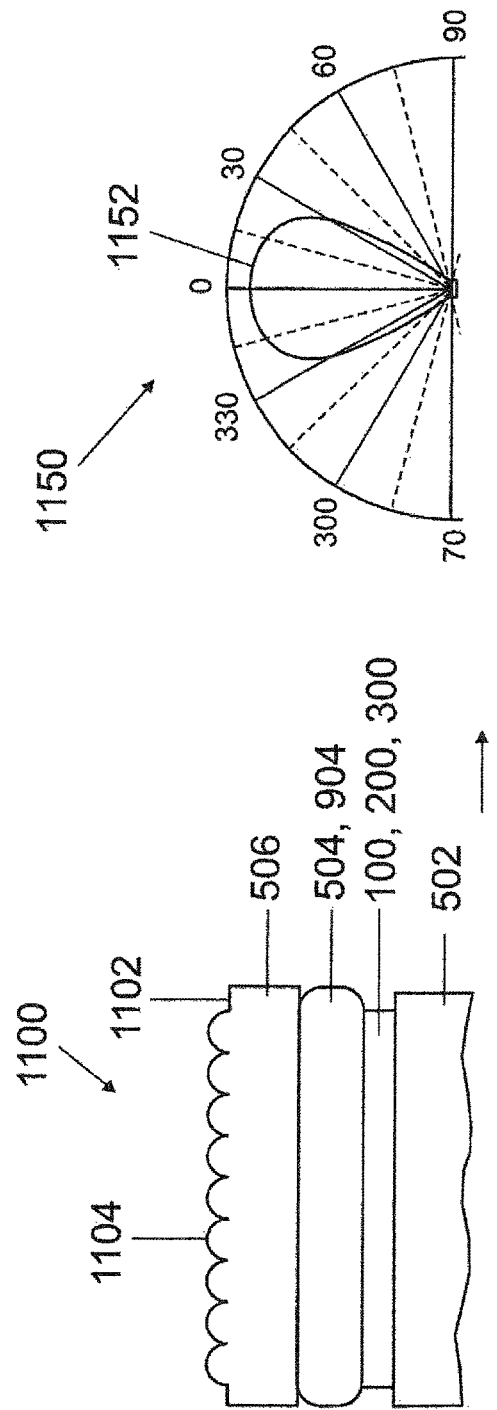
FIGS. 11A and 11B show a cross-sectional view of an optoelectronic component (FIG. 11A) in accordance with various embodiments and an associated emission profile (FIG. 11B)

FIG. 11A and FIG. 11B show a cross-sectional view of an optoelectronic component 1100 (FIG. 11A) in accordance with various embodiments and an associated emission profile 1152, illustrated in a first diagram 1150 (FIG. 11B). The optoelectronic component 1100 is similar to the optoelectronic component 500 in accordance with FIG. 5 or to the optoelectronic component 900 in accordance with FIG. 9, for which reason only a few differences are explained below. With regard to the remaining features, reference is made to the explanations with regard to the optoelectronic component 500 in accordance with FIG. 5 or with regard to the optoelectronic component 900 in accordance with FIG. 9. As illustrated in FIG. 11A, the exposed surface 1102 of the cover 506, for example of the cover glass 506 or of the cover film 506, has a lens structure 1104, for example. Furthermore, the material in the inner region has a refractive index that is lower than the refractive index of the material of the cover 506. This leads to a narrowed emission profile 1152, as illustrated in FIG. 11B.

FIG. 12A and FIG. 12B show a cross-sectional view of an optoelectronic component 1200 (FIG. 12A) in accordance with various embodiments and an associated emission profile 1252, illustrated in a second diagram 1250 (FIG. 12B). The optoelectronic component 1200 is similar to the optoelectronic component 500 in accordance with FIG. 5 or to the optoelectronic component 900 in accordance with FIG. 9, for which reason only a few differences are explained below. With regard to the remaining features, reference is made to the explanations with regard to the optoelectronic component 500 in accordance with FIG. 5 or with regard to the optoelectronic component 900 in accordance with FIG. 9. As illustrated in FIG. 12A, the surface 1202 of the cover 506, for example of the cover glass 506 or of the cover film 506, which is oriented toward the adhesive 504, 904 has a lens structure 1204, for example. Furthermore, the material in the inner region has a refractive index that is lower than the refractive index of the material of the cover 506. This leads to a so-called "batwing" emission profile 1252, as illustrated in FIG. 12B.

Consequently, illustratively in various embodiments, a low refractive index adhesive or a corresponding low refractive index liquid is used in the inner region for the beam shaping of the optoelectronic component, for example of an OLED.

Furthermore, in various embodiments, provision may be made for introducing thermally conductive particles, such as glass or graphite particles, for example, into the non-cured adhesive or liquid, for example the oil, or the silicone, etc., whereby the thermal conductivity of the layer can be increased further which can lead to an improved dissipation of heat from the active layers of the optoelectronic component, for example of the organic light emitting diode 100, 200, 300.

In various embodiments, hotspots that led to a short circuit with conventional methods can be reduced or alleviated in terms of their effect. In various embodiments, although hotspots can be detected, they need not necessarily lead to a failure of the optoelectronic component. This can lead to an improvement in the overall yield during the production of such optoelectronic components, for example OLEDs, and thus to a potential reduction of the production costs.

Furthermore, the HIL layer thickness can be reduced by various embodiments, thus resulting in cost savings by the reduction of the material consumption.

In the case of optically transparent OLED components, the reduction of the HIL layer thickness in various embodiments has a positive influence on the transparency, since, as a result of a smaller total layer thickness, the absorption within the OLED can be reduced and the transparency can be pushed into the first wide maximum of the etalon effect.

In accordance with various embodiments, the organic layers of the organic optoelectronic component, for example of the OLED, in the active area are not damaged with UV light, which can lead to an improvement in the aging behavior of the organic optoelectronic component, for example of the OLED.

By using materials having better thermal conductivity in the active region of the optoelectronic component, for example of the light emitting diode, for example of the OLED, in accordance with various exemplary embodiments, it is possible to homogenize the luminance distribution; furthermore, it is possible to improve the luminance aging in the case of large-area components.

By introducing suitable scattering layers within the active region of the optoelectronic component, for example of the light emitting diode, for example of the OLED, in accordance with various exemplary embodiments, it is possible, in the case of top emitting OLEDs, for example, to improve the coupling-out. However, in the case of transparent OLEDs, too, in various embodiments, provision is made for introducing a low concentration of scattering particles that are still not perceived by the eye.

By using liquids/oils/silicones, etc., having a specific refractive index and in combination with cover glasses/films having a specific structure, in accordance with various embodiments, it is possible, moreover, to influence the emission characteristic of the optoelectronic component, for example of the light emitting diode, for example of the OLED.

As has been described above, with the use of two different materials in accordance with different embodiments for the adhesive at the edge of the optoelectronic component or at the edge of the cover 506, on the one hand, and for the medium in the inner region, for example the active region of the optoelectronic component, on the other hand, optical gel can be used as the medium. For this purpose, in various embodiments, by way of example, it is possible to employ a printing process (for example using a stencil or a doctor blade, or the like) for the medium in the inner region, for example the active region of the optoelectronic component, and at the edge a dispensing process for the adhesive 504.

As medium, in various embodiments, as already described above, a liquid or a gel is provided in order to improve the optical coupling-out or in order to avoid short circuits. Furthermore, it is possible to use materials which improve the thermal conductivity and thus increase the lifetime of the optoelectronic component, for example of the OLED.

Figure 13:
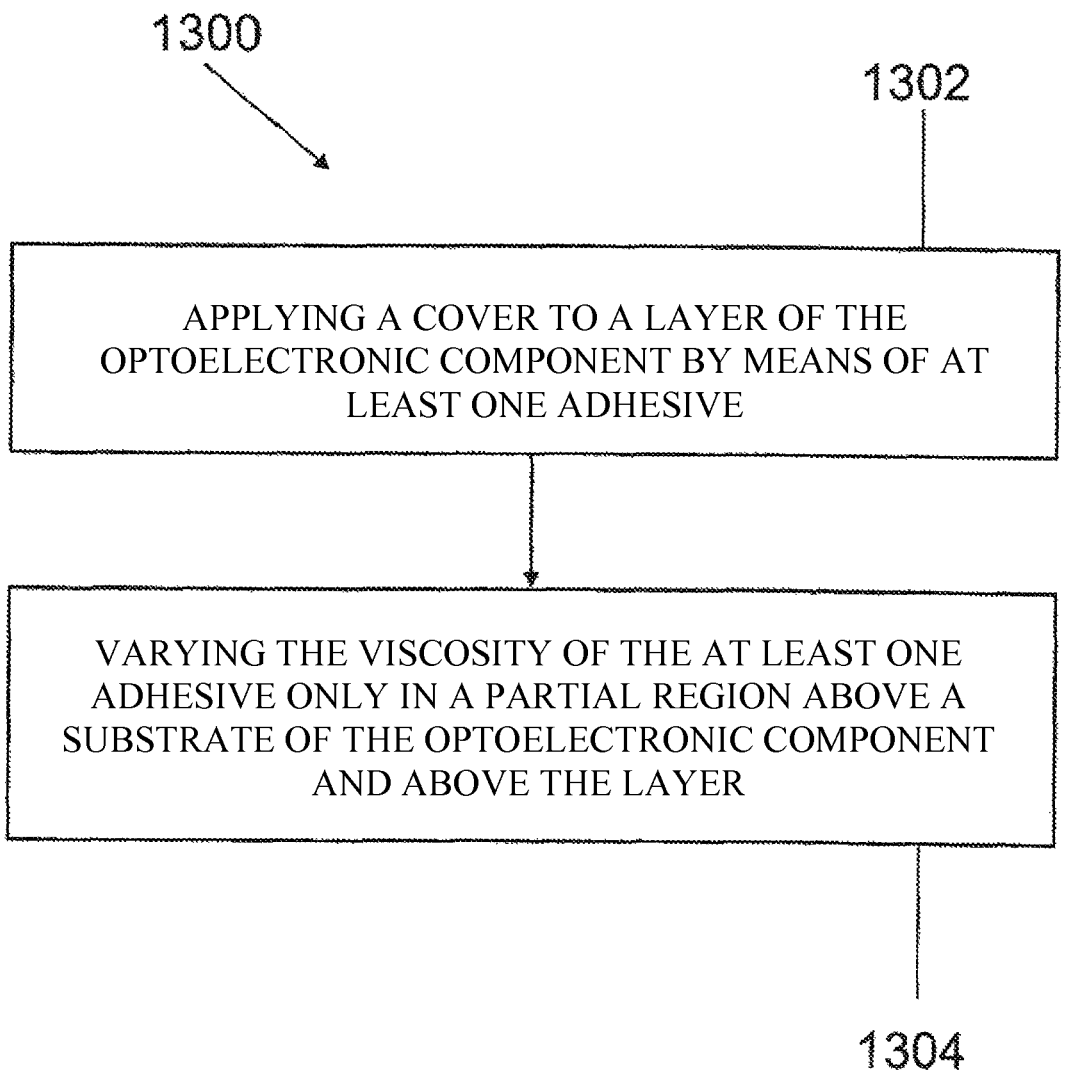
FIG. 13 shows a flow chart illustrating a method for producing an optoelectronic component in accordance with various embodiments.

FIG. 13 shows a flow chart 1300 illustrating a method for producing an optoelectronic component in accordance with various embodiments.

The method may include, in 1302, applying a cover to a layer of the optoelectronic component by means of at least one adhesive. In this case, by way of example, firstly the adhesive can be applied to a surface of the cover and then the cover with the adhesive oriented toward the carrier can be applied to the carrier and the layer of the optoelectronic component (for example a light emitting diode, for example organic light emitting diode, completed in the front end of line process). Alternatively, firstly the adhesive can be applied to the carrier and the layer of the optoelectronic component (for example a light emitting diode, for example organic light emitting diode, completed in the front end of line process) and then the cover can be applied to the adhesive.

Furthermore, the method may include, in 1304, varying the viscosity of the at least one adhesive only in a partial region above the substrate of the optoelectronic component and/or above the layer.

In various embodiments, the viscosity may be varied by means of light irradiation. In various embodiments, the light irradiation can be effected by means of irradiation by ultraviolet light.

While the disclosed embodiments has been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. An optoelectronic component, comprising:
   at least one layer of the optoelectronic component;
   at least one adhesive on the layer of the optoelectronic component; and
   a cover on the at least one adhesive;
   wherein the at least one adhesive is cured only in a partial region above at least one of a substrate and the layer; and
   wherein, after being cured, the partial region at least partly encloses a region in which a liquid adhesive is provided, wherein the liquid adhesive is configured to flow into a defect location.

2. The optoelectronic component as claimed in claim 1, wherein the partial region comprises the edge region of the at least one adhesive.

3. The optoelectronic component as claimed in claim 2, wherein the edge region is at least one part of a circumferential structure of the at least one adhesive.

4. The optoelectronic component as claimed in claim 1, wherein the partial region is arranged at least partly laterally outside an active region of the optoelectronic component.

5. The optoelectronic component as claimed in claim 1, wherein the at least one adhesive comprises a plurality of adhesives of differing viscosity.

6. The optoelectronic component as claimed in claim 1, wherein particles are provided in the adhesive, said particles having a different refractive index than the adhesive.

7. The optoelectronic component as claimed in claim 1, wherein the adhesive has a lower refractive index than the cover.

8. The optoelectronic component as claimed in claim 1, wherein an optically refractive layer is provided on at least one surface of the cover.

9. The optoelectronic component as claimed in claim 1, designed as a light emitting diode.

10. The optoelectronic component as claimed in claim 1, designed as an organic light emitting diode.

11. The optoelectronic component as claimed in claim 1, wherein the layer comprises an encapsulation layer of the optoelectronic component.

12. The optoelectronic component as claimed in claim 1, wherein the cover comprises glass.

13. The optoelectronic component as claimed in claim 1, wherein the cover comprises a film.

14. The optoelectronic component as claimed in claim 1, wherein the partial region at least partly encloses a region in which a liquid non-adhesive material is provided.

15. An optoelectronic component, comprising:
at least one layer of the optoelectronic component;
at least one adhesive on the layer of the optoelectronic component; and
a cover on the at least one adhesive;
wherein the at least one adhesive is cured only in a partial region above at least one of a substrate and the layer; and
wherein the partial region at least partly encloses a region in which a liquid non-adhesive material is provided.

16. The optoelectronic component as claimed in claim 15, wherein the at least one adhesive is cured in a partial region that at least partially encloses a region comprising the at least one adhesive in a liquid, uncured form.

17. The optoelectronic component as claimed in claim 15, wherein particles are provided in the at least one adhesive, said particles having a different refractive index than the at least one adhesive.

18. A method for producing an optoelectronic component, wherein the method comprises:
applying a cover to a layer of the optoelectronic component by means of at least one adhesive; and
varying the viscosity of the at least one adhesive only in a partial region above a substrate of the optoelectronic component and above the layer;
wherein, after varying the viscosity, the partial region at least partly encloses a region in which a liquid adhesive remains, wherein the liquid adhesive is configured to flow into a defect location.

19. The method as claimed in claim 18, wherein the viscosity is varied by means of light irradiation.

20. The method as claimed in claim 19, wherein the light irradiation is effected by means of irradiation by ultraviolet light.

* * * * *

UNITED STATES PATENT AND TRADEMARK OFFICE
CERTIFICATE OF CORRECTION

PATENT NO.        : 9,190,628 B2
APPLICATION NO.   : 14/117888
DATED             : November 17, 2015
INVENTOR(S)       : Dirk Becker et al.

Page 1 of 1

It is certified that error appears in the above-identified patent and that said Letters Patent is hereby corrected as shown below:

Specification

Column 8, line 56: Please write the unit "μm," between the number "1" and the word "if".

Column 13, line 61: Please delete the word "(adhesive-bonding" between the words "the" and "connection", and write the word "(adhesive-)bonding" in place thereof.

Column 16, line 7: Please delete the word "°LED," between the words "the" and "can", and write the word "OLED," in place thereof.

Signed and Sealed this
Fifteenth Day of March, 2016

Michelle K. Lee
*Director of the United States Patent and Trademark Office*